United States Patent
Shannon et al.

[11] 3,931,633
[45] Jan. 6, 1976

[54] ELECTRON TUBE INCLUDING A PHOTOCATHODE

[75] Inventors: John Martin Shannon; John Ernest Ralph, both of Salfords, near Redhill, England

[73] Assignee: U.S. Philips Corporation, New York, N.Y.

[22] Filed: Mar. 5, 1975

[21] Appl. No.: 555,604

Related U.S. Application Data
[63] Continuation of Ser. No. 398,479, Sept. 18, 1973, abandoned.

[30] Foreign Application Priority Data
Sept. 22, 1972  United Kingdom............... 43959/72
Sept. 22, 1972  United Kingdom............... 43956/72
Sept. 22, 1972  United Kingdom............... 43957/72

[52] U.S. Cl.................. 357/30; 357/22; 357/41; 357/45
[51] Int. Cl.².......................................... H01L 27/14
[58] Field of Search............. 357/30, 23, 41, 45, 22

[56] References Cited
UNITED STATES PATENTS
3,699,404  10/1972  Simon........................... 317/235 R
3,721,839  3/1973  Shannon........................... 307/304

*Primary Examiner*—Martin H. Edlow
*Attorney, Agent, or Firm*—Frank R. Trifari; Jack Oisher

[57] ABSTRACT

A semiconductor photocathode is described in which the electron emission is obtained from a P-type semiconductor into which free electrons are injected from the source or drain of an FET whose channel is normally blocked. Incident photons absorbed in the channel region unblock the FET causing electron emission. Preferably, the device comprises an imaging array of FET's and associated electron emitters.

11 Claims, 7 Drawing Figures

ELECTRON TUBE INCLUDING A PHOTOCATHODE

This is a continuation of application Ser. No. 398,479, filed Sept. 18, 1973, now abandoned.

This invention relates to a semiconductor cold cathode comprising an injecting junction with $p$-type semiconductor material, a free surface of said $p$-type material being situated not substantially greater than a diffusion length for electrons from said injecting junction.

A semiconductor cold cathode is disclosed in British Pat. No. 1,147,883. The work function at the surface of the $p$-type material for electrons injected by the junction into the conduction band thereof may be substantially suppressed by a surface treatment with the result that substantially all electrons injected into the $p$-type material and diffusing to the surface thereof can escape into a vacuum.

It is an object of the invention to provide an electron tube including a semiconductor photocathode having gain, particularly but not exclusively an imaging photocathode having significant gain.

The invention provides a semiconductor photocathode comprising one or more field effect transistor structures and an individual electron emissive element comprising an injecting junction with $p$-type semiconductor material electrically in series with the source and/or drain of the or each transistor structure, a free surface of said $p$-type semiconductor material being situated not substantially more than a diffusion length for electrons from said injecting junction, the or each transistor structure having a gate for producing a depletion region in the channel of that transistor structure and being situated so that electromagnetic radiation directed at the photocathode can generate charge carriers in said depletion region or within a diffusion length of said depletion region.

In a preferred form the photocathode comprises an array of such field effect transistor structures and associated emissive elements, each structure having a separate gate, which is preferably of the junction type.

If each gate is of the junction type it may be formed by a $p$-$n$ junction in the form of a homojunction between regions of different conductivity type but of the same semiconductor material, or may be formed by a rectifying heterojunction between different semiconductor material. The gate junction may alternatively be formed by a metallic contact on the material of the channel of the transistor structure to form a junction of the Schottky barrier type.

Preferably a common addressing conductor is provided for all the gates, said conductor being coupled to each gate via an individual barrier against charge leakage from the gate to the conductor. Each such barrier may be formed by a capacitor or a rectifying junction in the form of a $p$-$n$ homojunction, a rectifying heterojunction or a Schottky barrier junction.

The said free surface of the $p$-type semiconductor material of an emissive element associated with the or each transistor may be coated with a material having a work function less than or equal to the distance between the Fermi level and the bottom of the conduction band in the $p$-type material. The coating material may be cesium or cesium and oxygen such as a cesium oxygen monolayer.

A $p$-$n$ junction biassed in the forward direction may be used for injection of electrons into the $p$-type material. As an alternative an injecting point contact may be used therefor.

The photocathode may, for example, be included in an image intensifier and/or converter tube and include a phosphor screen and means, such as further electrodes, for focussing electrons emitted by the photocathode, onto said screen.

Embodiments of the invention will now be described, by way of example, with reference to the accompanying diagrammatic drawings in which.

Figure 1:
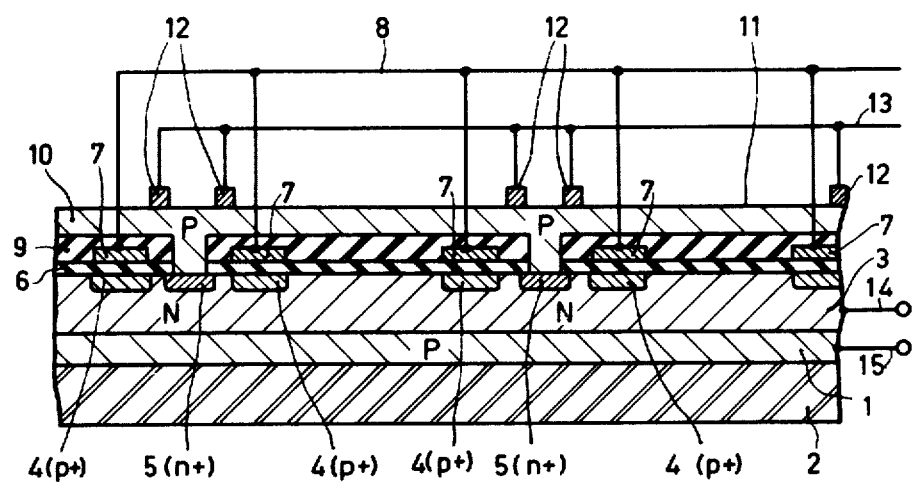
FIG. 1 is a cross section through part of a first imaging active semiconductor photocathode for use in an electron tube.

In FIG. 1 a layer 1 of $p$-type monocrystalline silicon is provided on a transparent glass support plate 2. A layer 3 of monocrystalline $n$-type silicon is grown epitaxially on the layer 1. An array of annular $p^+$-regions 4 are formed in the top surface of the layer 3 by diffusion, as are $n^+$-regions 5 which are situated at the center of each annular region 4. After the regions 4, 5 have been provided on the surface of layer 3, it is completely covered by a thin insulating layer 6.

Annular metallic contacts 7, for example of gold or aluminum, are deposited on the layer 6 above each region 4. These contacts 7 are all connected together by means of conductors deposited on the layer 6 and depicted diagrammatically as a conductor 8.

A further insulating layer 9 is provided extending over the insulating layer 6 and covering the contacts 7. Openings are then provided in the insulating layers 6 and 9 above the $n^+$-surface regions 5.

A thin layer 10 of $p$-type silicon is provided over layer 9 and extends in the openings in the insulating layers 6 and 9 in contact with the $n^+$-regions 5. On the upper surface 11 of the silicon layer 10 annular electrodes 12, for example of gold or aluminum are present and are coaxial with the annular $p^+$-surface regions 4. The electrodes 12 are interconnected by conductors deposited on the surface 11 and depicted diagrammatically as a conductor 13. The upper surface 11 is also provided with a substantially monatomic layer (not shown) of cesium-oxygen to reduce the work function thereat to substantially zero.

In operation an interrogation positive potential is applied to the line 13 and hence to the electrodes 12, relative to a terminal 14 connected to the layer 3 and which may be provided in the form of an $n^+$-grid between the annular $p^+$-regions 4. The current path from the electrodes 12 is through the silicon layer 10 in the openings in the insulating layers 6 and 9 to the $n^+$-regions 5 and then laterally through the layer 3. A positive setting pulse is applied to conductor 8 which forward biases the *p-n* junctions between the regions 4 and layer 3 and therefore charges the MOS capacitors formed by the contacts 7, insulating layer 6 and regions 4. At the end of the positive pulse the contacts 7 return to the potential of layer 3, carrying the regions 4 negative and hence reverse-biasing the junctions between regions 4 and layer 3 and producing an annular depletion region below each. The magnitude of the resetting pulse and the thickness and resistivity of the layer 3 are chosen so that all these depletion regions extend to the junction between layer 1 and layer 3 (the terminals 14 and 15 for the layers 3 and 1 are connected together in this mode of operation) thus pinching off the current path from terminal 14 to each region 5 and hence to each electrode 12. Such a mode of operation, with the depletion regions all extending to the zero-biassed junction below the layer 3 will be referred to as the "punch through" mode. When the regions reach said junction the *p*-type layer 1 injects holes into the layer 3 and the depletion region is thereby limited and extends up to but not beyond the junction between layers 1 and 3. The array thus operates as an array of junction field-effect transistor structures whose common source connection is the terminal 14, whose gates are the regions 4 and whose drain electrode regions are the regions 5. If now a radiation pattern which is capable of generating free charge carriers in the layer 3 is focussed thereon through the plate 2 and layer 1 the depletion region under each gate 4 will contract in the intervals between successive resetting pulses in accordance with the local radiation intensity. During application of the interrogation positive potential to line 13 in these intervals a current will flow to the corresponding region 5, the magnitude of this current depending on the extent of contraction of the corresponding depletion region and hence on the amount of radiation absorbed within that depletion region or within a diffusion length thereof since the end of the preceding resetting pulse. By this means the electron injecting *p-n* junction between the corresponding region 5 and layer 10 is forward biased. Electrons are thereby injected into the conduction band of the *p*-type silicon layer 10, diffuse to the surface 11, and a substantial proportion are emitted into the vacuum thereat. They are then accelerated and focussed onto the phosphor screen of the tube to produce an intensified display corresponding to the input radiation pattern.

It will be noted that the device is capable of integrating the effect of the input radiation, exposure thereto for a longer time resulting in increased contraction of the depletion regions and enhanced emission from the corresponding part of the surface 11. The device can be reset by applying another positive pulse to the line 8.

If desired, a negative potential may be applied to a terminal 15 connected to layer 1, relative to terminal 14, to reverse-bias the junction between layers 1 and 3 and produce a further depletion layer which will extend into the layer 3 towards the depletion layers under the gates 4 for a distance which depends on the magnitude of this potential. It will be evident that the application of such a potential can move the photo-sensitive part of the layer 3 away from the interface 1, 3 and, because red light will penetrate into layer 3 further than blue light, the relative sensitivity of the device to red and blue light can be varied.

If desired, the individual capacitive couplings of the addressing line 8 to the gates 4 may be replaced by individual rectifying junction couplings polarised so that negative charge can be deposited on the regions 4 from the line 8 but cannot leak back to the line 8 when the resetting pulse is removed. Thus the contacts 7 may extend through the insulator 6 and contact the corresponding $p^+$-region 4 to form a Schottky barrier therewith. It will be evident that, if such rectifying couplings are employed, the polarity of the resetting pulses applied to the line 8 should be suitably chosen; the pulses may be either negative-going or positive-going depending on the nature of said couplings.

It should be noted that the charge storage mode of operation of the array of junction field-effect transistors described above is similar to that disclosed in U.S. Pat. No. 3,721,839 issued to one of us. The gates 4 may, if desired, alternatively be addressed via individual MOS transistors as disclosed in that patent.

Figure 2:
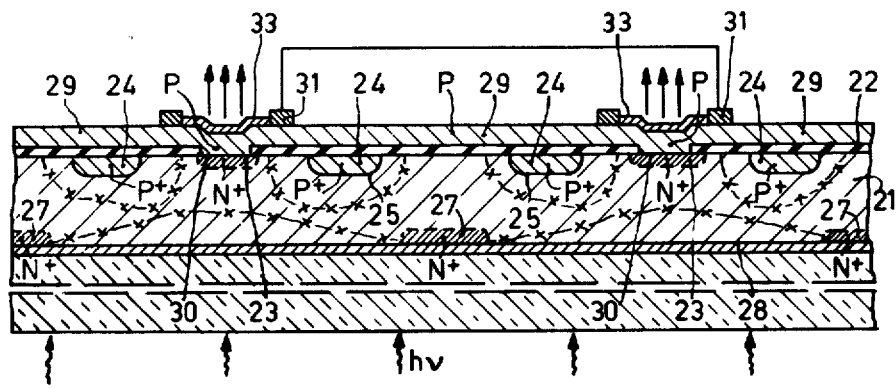
FIG. 2 is a cross-section through part of a second imaging active semiconductor photocathode for use in an electron tube.
Figure 3:
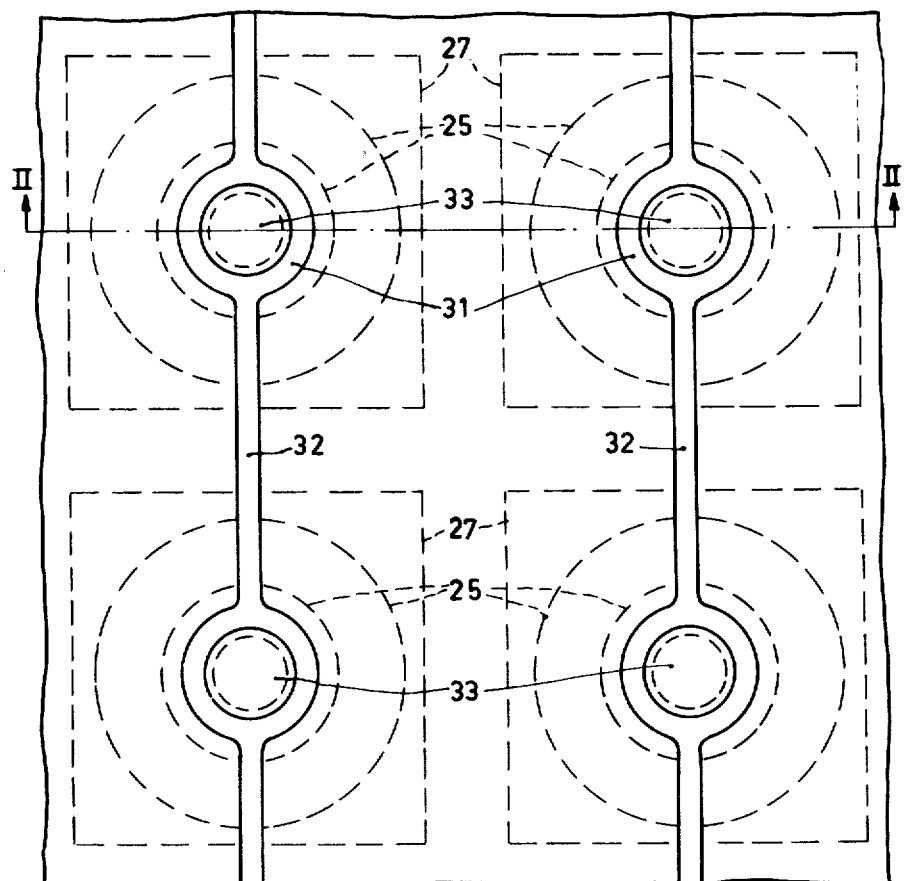
FIG. 3 is a plan view of the photocathode shown in FIG. 2, the section of FIG. 2 being taken along line II-II of FIG. 3.

In FIGS. 2 and 3 a two terminal imaging active photocathode comprises an array of JFET structures, two of which are shown in the cross-section of FIG. 2 and four of which are shown in the plan view of FIG. 3. On the surface of an *n*-type semiconductor layer 21, for example of silicon, there is an insulating layer 22 of silicon oxide. Each JFET structure comprises a central $n^+$ drain electrode region 23 of circular outline which is surrounded by an annular $p^+$ gate electrode 24, the gate electrode regions forming *p-n* junctions 25 with the *n*-type layer 21. The source electrode regions of all the JFET structures are formed by a single $n^+$ region 27 in the form of an $n^+$ grid region at the lower surface of the *n*-type layer 21, the apertures in the grid being symmetrically disposed with respect to the overlying circular drain electrode region 23. On the lower surface of the *n*-type layer 21 there is a thin metal layer 28 for example of platinum, which forms an ohmic connection to the $n^+$ source electrode region 27 and a Schottky junction with the other portions of the *n*-type surface layer 21. The layer 21 with applied metal layer 28 which allows passage of radiation incident as shown, is supported by a glass plate also permitting passage of the incident radiation.

On the surface of the insulating layer 22 there is a deposited layer 29 of high resistivity *p*-type polycrystalline silicon. The layer 29 extends in openings in the insulating layer 22 and forms drain connections 30 with the $n^+$ drain electrode regions 23. The drain connections 30 also constitute injection connections for injection of electrons from the $n^+$-regions 23 into the overlying portions of the *p*-type layer 29. Situated on the surface of the *p*-type layer 29 there are a plurality of annular metal layer portions 31 which from ohmic connections to the layer 29. The metal layer portions 31 each surround the drain connection 30 of an imaging JFET structure. Further metal layer portions 32 in the form of strips extend on the surface of the *p*-type layer 29 and interconnect the annular metal layer portions 31. Thus the portions 31 and 32 form a first common terminal for the JFET structures. A second common terminal for the JFET structures is formed by the metal layer 28 which forms ohmic connections to the $n^+$ source grid region 27.

In each JFET structure the $p^+$ gate electrode region 24 is capacitively connected to the drain connection 30. This is achieved due to the *p*-type layer 29 overlying the insulating layer 22 above the annular gate electrode region 24. The *p*-type layer 29, insulating layer 22 and gate electrode region 24 thus consitutes a storage capacitor and each metal layer portion 31 thus forms a common connection to the drain connection 30 and the side of the storage capacitor remote from the gate electrode.

On the surface portions of the p-type layer 29 within the annular metal layer portions 31 there is a coating 33 of a material for reducing the electron work function, for example of cesium or a cesium-oxygen monolayer. Electrons injected into the p-type layer 29 by the injecting drain connection 30 can emerge from the surface of the coatings when the device is placed in an evacuated enclosure (not shown) under a suitable external electric field. As in the embodiment of FIG. 1 the distance between the injecting connection and the emissive surface is chosen to be not substantially greater than a diffusion length and with this in view the thickness of the p-type layer is chosen accordingly. Operation is similar to that of the embodiment of FIG. 1, with the exception that the resetting pulses are added to the interrogation potential applied to the first common terminal 31, 32 relative to the second common terminal 28. Said interrogation potential may be in the form of pulses interspersed between the resetting pulses or it may be a steady potential to which the resetting pulses are added.

Isolation between individual emissive surface parts of the p-type layer 29 is achieved due to the p-type layer 29 having a high resistivity.

Similarly to FIG. 1, the n-type layer 21 may as an alternative be present on a p-type substrate, the source electrode region then being present at the upper surface of the layer 21.

The incident radiation pattern may be directed at the upper side of the device in which case the p-type semiconductor layer 29 should be made sufficiently thin to be radiation transmitting.

Figure 4:
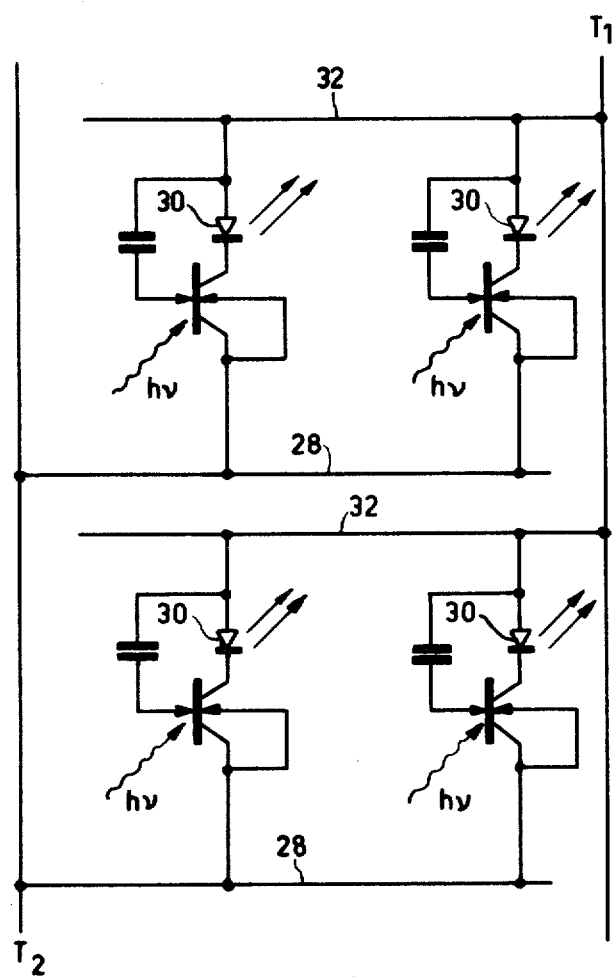
FIG. 4 is a circuit diagram of the part of the photocathode shown in FIG. 3.

FIG. 4 shows a circuit diagram of the part of the device shown in FIG. 3. The feed to the first common terminal formed by the metal layer portions 31, 32 is denoted by $T_1$ and the feed to the second common terminal 28 is denoted by $T_2$.

FIG. 2 shows in broken outline the boundaries of the depletion regions associated with the gate p-n junctions and the Schottky junction 21, 28 at a certain time between resetting pulses when radiation is incident and has caused the gate depletion regions to retract thus opening up the channels. The depletion region associated with the junction 21, 28 has a greater thickness below the $n^+$-regions 23 than adjacent the $n^+$-regions 27 due to the lateral voltage drop in the layer 21 between the regions 27 and 23.

Figure 5:
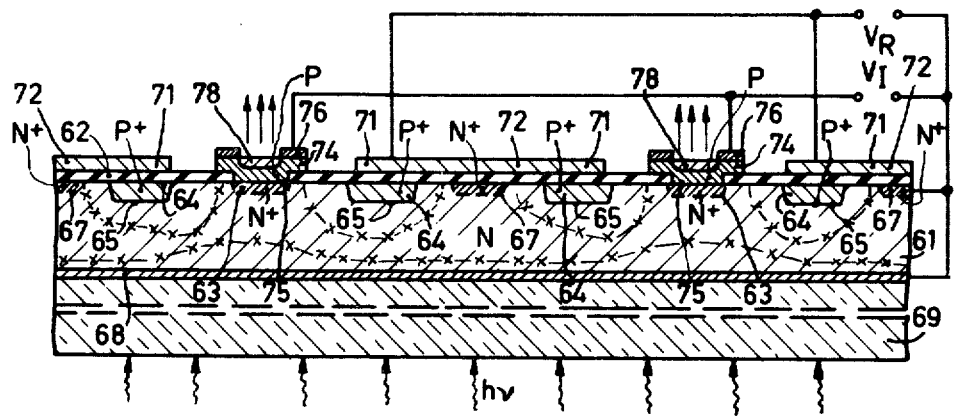
FIG. 5 is a cross-section through part of a third imaging active semiconductor photocathode for use in an electron tube.
Figure 6:
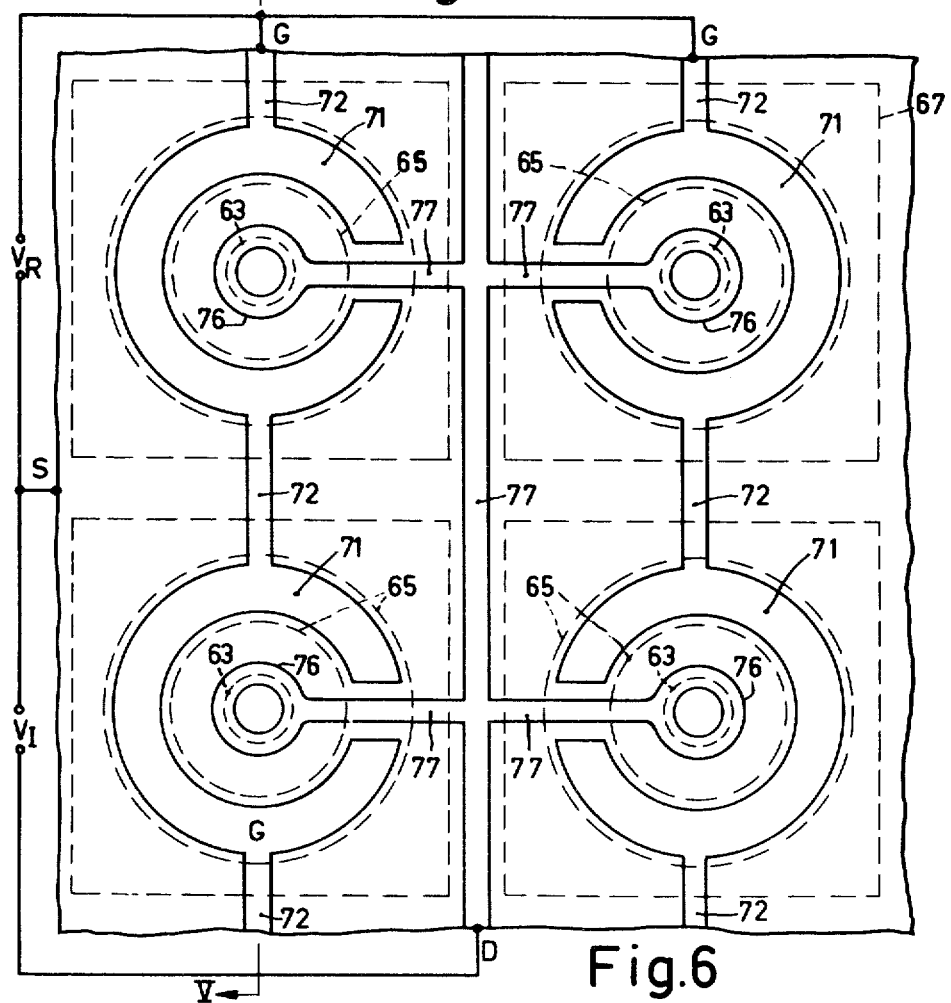
FIG. 6 is a plan view of the photocathode shown in FIG. 5, the section of FIG. 5 being taken along the line V—V of FIG. 6.

FIGS. 5 and 6 show part of a three terminal imaging active photocathode which has similarities to the embodiment of FIG. 1. The photocathode comprises an array of JFET structures, two of which are shown in the cross-section of FIG. 5 and four of which are shown in the plan view of FIG. 6. On the surface of an $n$-type layer 61, for example of silicon, there is an insulating layer 62 of silicon oxide. Each JFET structure comprises a central $n^+$-drain electrode region 63 of a circular outline which is surrounded by an annular $p^+$-gate electrode region 64, the gate electrode regions 64 forming p-n junctions 65 with the n-type layer 61. The source electrode regions of all the JFET structures are formed by a single $n^+$-region 67 in the form of an $n^+$-grid region extending at the upper surface of the layer 61, the apertures in the grid being symmetrically disposed with respect to the circular drain electrode regions 63. A common source connection is made to the grid 67 and provided with a terminal connection S. On the lower surface of the n-type layer 61 there is a thin metal layer 68, for example of platinum, which forms a Schottky junction with the n-type layer 61. The layer 61 with applied metal layer 68, which allows passage of radiation incident as shown, is supported by a glass plate 69.

On the surface of the insulating layer 62 there is a substantially C-shaped isolated gate connection metal layer portion 71 above the gate electrode region 64 of each JFET structure. The metal layer portions 71 are interconnected by further metal layer portions 72 and a common gate terminal connection G is provided to the layer portions 71, 72. Each metal layer portion 71 is thus isolated from the underlying gate electrode region 64 and an MOS storage capacitor is thus formed in series with each gate electrode region 64.

In openings of circular outline in the insulating layer 62 above the drain electrode regions 63 there are deposited layer portions 74 of high resistivity p-type polycrystalline silicon. The p-type portions 74 which also extend partly on the insulating layer 62 form drain connections 72 with the $n^+$-drain electrode regions 63. The drain connections 75 also constitute junctions for injection of electrons from the $n^+$-regions 63 into the p-type layer portions 74. On the periphery of each p-type layer portion 74 there is an annular metal layer portion 76 which forms an ohmic connection to the p-type layer portion 74. The metal layer portions 76 are all interconnected by further metal layer portions 77 extending on the insulating layer 62 and provided with a common drain terminal connection D.

On the surfaces of the p-type layer portions 74 within the annular metal layer portions 76 there are coatings 78 of a material for reducing the electron work function, for example of cesium or cesium oxide. A substantial proportion of electrons injected into the p-type layer portions 74 by the injecting drain connections 75 can emerge from the surface of the coatings when the device is placed in an evacuated enclosure (not shown) under a suitable external electric field. Again the distance between the injecting junctions and the emissive surface is not substantially greater than a diffusion length and with this in view the thickness of the p-type layer portions 74 is chosen accordingly. Electron emission may be obtained when conduction occurs in the repective JFET structure between source and drain connections. By simultaneous operation of all the JFET structures in the charge storage mode as described with reference to FIG. 1 an imaging photocathode action is again obtained having appreciable gain due to the amplification provided by each JFET structure. Thus a radiation pattern incident as shown at the lower side of the device may be converted into an electron emission pattern as shown at the upper side of the device, the conversion being obtained with gain.

FIGS. 5 and 6 show the circuit connection of the device terminals S, G and D, the terminal S also being connected directly to the metal layer 68 for operation in the punch-through mode. The interrogation and reset voltages are denoted by $V_I$ and $V_R$ respectively.

Figure 7:
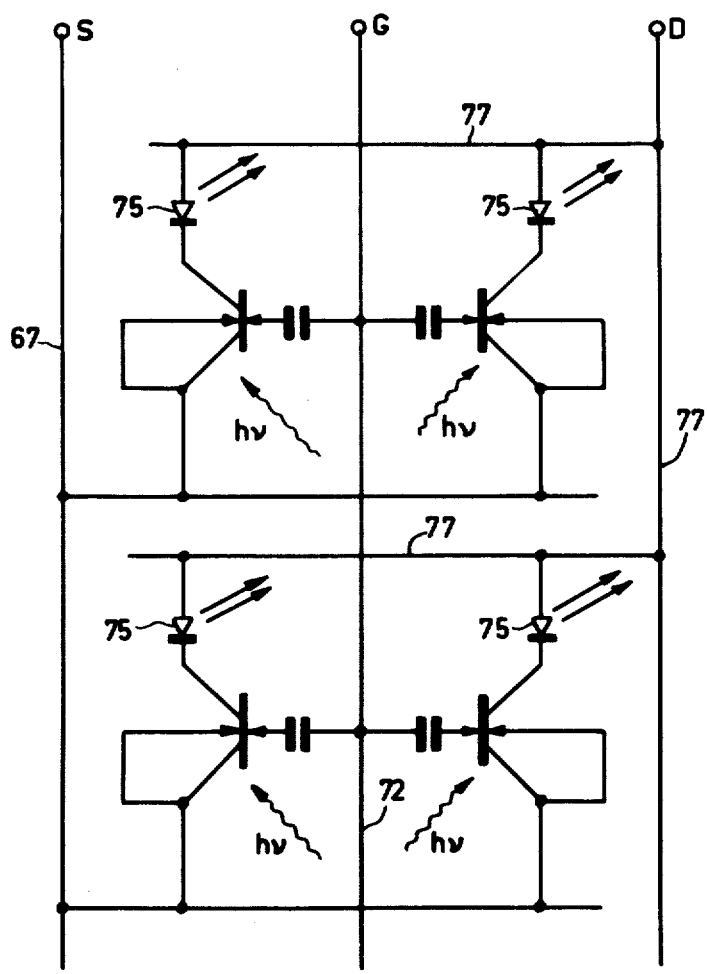
FIG. 7 is a circuit diagram of the part of the photocathode shown in FIG. 6.

FIG. 7 shows a circuit diagram of the part of the device shown in FIG. 6. The p-n junction electron injecting drain connections 75 are shown and electron emission is shown emanating from the p-type layer portions 74.

The active semiconductor photocathode described may be employed, for example, in an image converter and/or intensifier tube comprising an evacuated envelope containing the photocathode, a phosphor screen, and electrostatic means for accelerating free electrons released from the photocathode and focussing them on the screen in known manner.

The junction gates in the FET structures described may, if desired, be replaced by MOS gates.

Although in the embodiment described the photocathodes comprise arrays of transistor structures each having an associated emissive element electrically immediately in series with its drain, it will be evident that the emissive element may alternatively or additionally be provided immediately in series with the sources of the structures. Moreover, a photocathode in accordance with the invention may include only a single field effect transistor structure. Such a photocathode having a single transistor structure may be advantageously employed for converting a modulated laser beam input into a modulated electron beam output.

It should be noted that the embodiments of FIGS. 2 to 7 also form part of the disclosures of copending Application Serial No. 398,491, filed Sept. 18, 1973.

What we claim is:

1. A semiconductor photocathode comprising a semiconductor body having an $n$-type portion and having a surface, a p-type zone at the body surface and forming a $p$-$n$ junction located not substantially more than a diffusion length for electrons from a free surface of said $p$-type zone, said free surface of said $p$-type zone being coated with material producing a work function less than or equal to the distance between the Fermi level and the bottom of the conduction band in said $p$-type semiconductor, a field effect transistor having source and drain regions separated by a channel region in the $n$-type portion and having a gate electrode at a surface of the $n$-type portion and separated by a barrier from the channel region, means connecting electrically in series the $p$-type zone, the $p$-$n$ junction, and one of the transistor source and drain regions, means for electrically pulsing the gate whereby a depletion region is established in the channel substantially cutting off current therein, and means for applying a potential across the field effect transistor and the $p$-type zone and $p$-$n$ junction such that that $p$-$n$ junction becomes forward biased when current is caused to flow through the channel region by contraction of the depletion region, said transistor structure being mounted such that electromagnetic radiation directed at the photocathode can reach the channel and generate charge carriers in or within a diffusion length of said depletion region thereby causing contraction thereof in accordance with the intensity of the incident radiation causing current to flow through the channel, whereby electrons are injected into the $p$-type zone and upon reaching the coated surface will become emitted therefrom.

2. A photocathode as claimed in claim 1, wherein the transistor is of the $n$-channel type, the $n$-type material which forms the injecting $p$-$n$ junction with the $p$-type semiconductor also forming said one of the source and drain regions of the transistor.

3. An imaging device comprising a common semiconductive $n$-type layer having opposed major surfaces, an array of junction field effect transistors in said $n$-type layer each having source and drain regions spaced apart by a channel region and each having a separate surface gate spaced by a barrier junction from a channel region and capable when pulsed of establishing a depletion region in the channel, said channel regions all being located in the said common semiconductive layer, an array of $p$-type semiconductor zones each forming a $p$-$n$ junction with the $n$-type layer located not more than a diffusion length for electrons from a free surface of the $p$-type zones, a low work function material coating on the free surface of the $p$-type zones forming an electron emissive element, each of said $p$-type zones being electrically connected in series with the source and drain regions of one of the transistors, said array of transistors being mounted such that electromagnetic radiation in the form of an image directed from outside the array can reach the channels and generate charge carriers in or within a diffusion length of said depletion regions thereby causing contraction thereof in accordance with the intensity of the radiation incident thereon, and means for applying a potential across the array of transistors and array of $p$-type zones such that when the depletion regions contract, the series-connected $p$-$n$ junction becomes forward biased injecting electrons into the adjacent $p$-type zone which upon reaching the coated surface will become emitted therefrom, the magnitude of said emission from each $p$-type zone being related to the radiation intensity on the channel region connected in series with said $p$-type zone.

4. An imaging device as claimed in claim 3, wherein each transistor structure has a separate gate and the device includes a common addressing conductor for all said gates, said addressing conductor being coupled to each gate via an individual barrier preventing charge leakage from the gate to the conductor.

5. An imaging device as claimed in claim 4, wherein the barriers each comprise a capacitor.

6. An imaging device as claimed in claim 3, wherein the gates all lie substantially at the same major surface of said layer and each is of a configuration for producing a depletion region which surrounds a current path from a source region to a drain region for the corresponding transistor structure, and a connection lying substantially at and electrically contacting said same major surface.

7. An imaging device as claimed in claim 6, wherein the said connection which lies substantially at said same major surface contacts said same major surface via the associated emissive element.

8. An imaging device as claimed in claim 6 and including a further layer contacting an oppositely-located major surface of the semiconductor layer, and means for applying a potential to said further layer for producing a depletion region extending into the semiconductor layer.

9. An imaging device as claimed in claim 6, wherein a common addressing conductor is provided for all the gates and also constitutes a common supply conductor for said connections lying substantially at said same major surface.

10. An imaging device as claimed in claim 6, wherein both source and drain connections for each transistor lie substantially at and electrically contact said same major surface.

11. A photocathode as claimed in claim 6, wherein the $p$-type semiconductor of all the emissive elements is in the form of a single layer overlying a major surface of said layer of semiconductor material.

* * * * *